United States Patent [19]

Schaub

[11] Patent Number: 5,365,233
[45] Date of Patent: Nov. 15, 1994

[54] METHOD FOR DIGITIZING A BAND-LIMITED, ANALOG SIGNAL, ANALOG-DIGITAL PROCESSING UNIT TO IMPLEMENT THE METHOD, A METHOD FOR DIGITAL FILTERING AND A DIGITAL FILTER FOR ITS IMPLEMENTATION

[75] Inventor: Arthur Schaub, Wolfhausen, Switzerland

[73] Assignee: Ascom Audiosys AG, Switzerland

[21] Appl. No.: 13,824

[22] Filed: Feb. 3, 1993

[30] Foreign Application Priority Data

Feb. 4, 1992 [CH] Switzerland ............... 00 311/92-5

[51] Int. Cl.$^5$ ............................................ H03M 1/18
[52] U.S. Cl. ..................................... 341/139; 341/106
[58] Field of Search ...................... 341/139, 106, 118

[56] References Cited

U.S. PATENT DOCUMENTS

| | | | |
|---|---|---|---|
| 4,366,469 | 12/1982 | Michaels et al. | 341/139 |
| 4,625,240 | 11/1986 | Yablonski et al. | 358/143 |
| 4,817,025 | 3/1989 | Asai et al. | 364/724.01 |
| 4,851,842 | 7/1989 | Iwamatsu | 341/139 |
| 4,910,515 | 3/1990 | Iwamatsu | 341/110 |
| 5,170,166 | 12/1992 | Tanaka et al. | 341/139 |

FOREIGN PATENT DOCUMENTS

| | | |
|---|---|---|
| 0436222 | 7/1991 | European Pat. Off. . |
| 0492578 | 1/1992 | European Pat. Off. . |
| 2232024 | 11/1990 | United Kingdom . |

OTHER PUBLICATIONS

Telecommunications and Radio Engineering, "An Analog-Digital Converter with a Large Dynamic Range," pp. 135-136, vol. 44, No. 9, Sep. 1989.

*Primary Examiner*—Marc S. Hoff
*Attorney, Agent, or Firm*—Nies, Kurz, Bergert & Tamburro

[57] ABSTRACT

An analog-digital processing unit including an amplifier with amplification that is adjustable in stages, and a quantizer outlet connected downstream of the amplifier. The output of the quantizer acts as actual value to control the amplification of the amplifier. With the assistance of the instantaneous value output from the quantizer, and the instantaneous prevailing amplification, the signal values, compensated by the instantaneous amplification, are defined and are output in a memory and scaling unit.

26 Claims, 6 Drawing Sheets

METHOD FOR DIGITIZING A BAND-LIMITED, ANALOG SIGNAL, ANALOG-DIGITAL PROCESSING UNIT TO IMPLEMENT THE METHOD, A METHOD FOR DIGITAL FILTERING AND A DIGITAL FILTER FOR ITS IMPLEMENTATION

BACKGROUND OF THE INVENTION

FIELD OF THE INVENTION

The present invention pertains to a method for digitizing a band-limited, analog signal and also to an analog-digital processing unit; and furthermore to a method for digital filtering of digital signals and a digital filter for its implementation.

DESCRIPTION OF THE RELATED ART

In particular directed toward the processing of analog voice signals, as for digital operating hearing aids, the first goal of the present invention is to create a method or a unit of the first-stated type, where an analog-digital quantization unit with a reduced quantizing step number is used, so that the dynamics of the analog signal, approximately 80 dB for voice signals is essentially retained, and that in spite of the few quantizing steps, the quantizing error, relative to the useful signal, remains small.

SUMMARY OF THE INVENTION

Due to the possibility for reducing the number of quantizing steps at the quantizer, a significant reduction in the necessary number of functions installed would be achieved.

This problem will be solved according to this method, by digitizing a band-limited, analog signal. The analog signal is amplified and the amplified analog signal is digitized in a preset number of quantizing steps. With the digitized analog signals, the amplification of the analog signal is set so that the average value over time of the size of the digitized analog signal is controlled to a design value. All possible values of the digitized analog signal, according to the number of quantizing steps, will be prestored. With the particular digitized analog signal and the particular prevailing amplification, the prestored signal corresponding to the digitized, analog signal, amplified with the inverse amplification of the prevailing amplification, will be called up.

Furthermore, it is also a task of the present invention to propose a method for digital filtering and/or to propose a digital filter operating accordingly, where multiplication elements to multiply the digital signal on the input side by the filter coefficient are unnecessary. Thus the hardware expense will be reduced considerably.

The second task above will be solved by proceeding according to a method for digital filtering of digital signals. The digital signals are multiplied by filter coefficients in each of memory, and scaling units are allocated to the filter coefficients. The filtering is performed by the addressing of all memory and scaling units with a particular digital signal and by time-shifted switching of the particular output values from those units to a summation unit.

The invention will be explained by examples below with reference to the figures.

Additional advantages of the present invention, together with their various aspects, will also proceed from this description.

BRIEF DESCRIPTION OF THE DRAWINGS

FIG. 1 shows a signal flow/functional block diagram of an analog-digital processing unit per this invention that operates according to the invented method.

Figure 1:
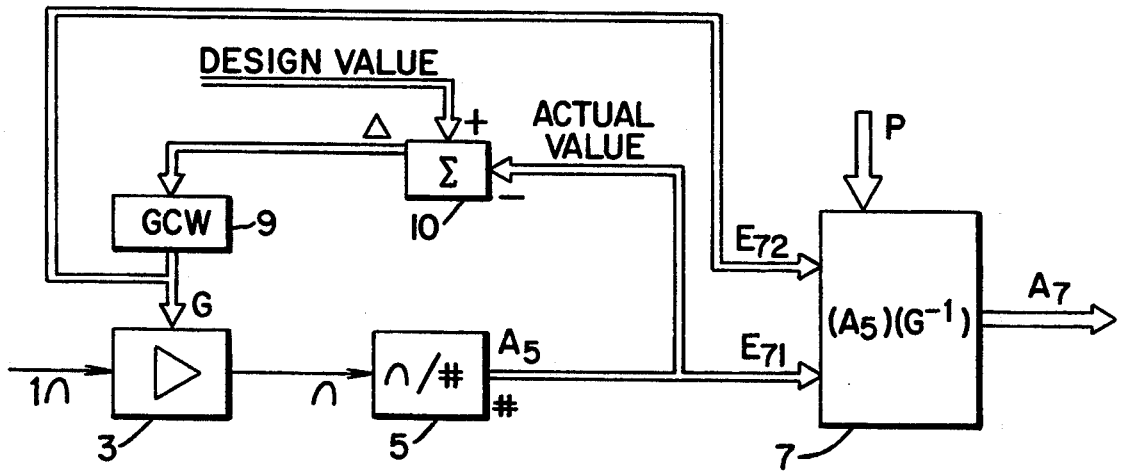
FIG. 1: A simplified, functional block, signal-flow diagram of an analog-digital processing unit in accordance with this invention, that operates according to the invented method.

The analog signal 1 will be fed to an amplifier unit 3 whose amplification G is adjustably controllable in steps. The amplified output signal of the amplifier unit 3 will be fed to an analog-digital quantizer 5, whose digital output signal $A_5$ is fed, on the one hand, to a memory and scaling unit 7, and on the other hand, it is fed back to a memory device 9 for amplifier control data, e.g. in the form of the word GCW.

Basically, the digital output signals $A_5$ of the quantizer 5 will be fed back as an actual value, to the memory unit 9, so that the control data for the amplification G of the amplifier unit 3, will be continually adjusted in such a way that the output values $A_5$ of the quantizer 5, or more precisely their average, absolute value, will correspond to a prespecified design value, and thus the limited value range of the quantizer 5 will be used optimally. This is illustrated schematically in FIG. 1 with the difference forming unit 10 that forms the control difference $\Delta$. The amplification values G and their adjusting values $\Delta G$ are calculated preferably in dB.

All possible values of the output signal $A_5$ will be stored in advance in the memory and scaling unit 7, and they are also predetermined, scaled by all possible values of the inverse amplification G, that is, $G^{-1}$. Now if the output signal $A_5$ can take on the "$n_a$" different values and the amplification G can take on "$n_g$," then in the memory and scaling unit, the number $n_a \cdot n_g$ values are predetermined, or at least prestored in part, as is illustrated by the input P. At the input $E_{71}$ of the memory and scaling unit 7, the output signals $A_5$ of the quantizer 5 are also applied as addresses and likewise the GCW is applied to $E_{72}$. Corresponding to the instantaneous value of signal $A_5$, the pertinent data set scaled by the instantaneous inverse amplification $G^{-1}$, will be addressed at unit 7. Thus at the output side A7 of the memory and scaling unit 7, the numerical value of the (unamplified or unattenuated) analog signal 1 will appear.

Thanks to the amplification on the input-side, before the digitizing, and the output-side amplification compensation occurring after the digitizing, the full dynamics of the analog signal will be reflected in the numerical range by means of a quantizer 5 with few quantizing steps.

Based on the regulation of the average absolute value of the output signal $A_5$ of the quantizer 5 at a preset design value, furthermore, the available dynamics of the quantizer will be fully utilized and thus the quantizing error will be minimized within the framework of the specified number of quantizing stages, regardless of the input analog signal level and the continuing fluctuations in level. The potential for the use of a quantizer with relatively few stages and nonetheless also the use of an analog-digital conversion across the entire dynamic range of analog signals with an always sufficiently small, relative quantizing error, will provide significant advantages, if we consider that the quantizer, with respect to power consumption (in addition to anti-aliasing filters), represents the critical part of the circuitry in an analog/digital conversion.

Figure 2:
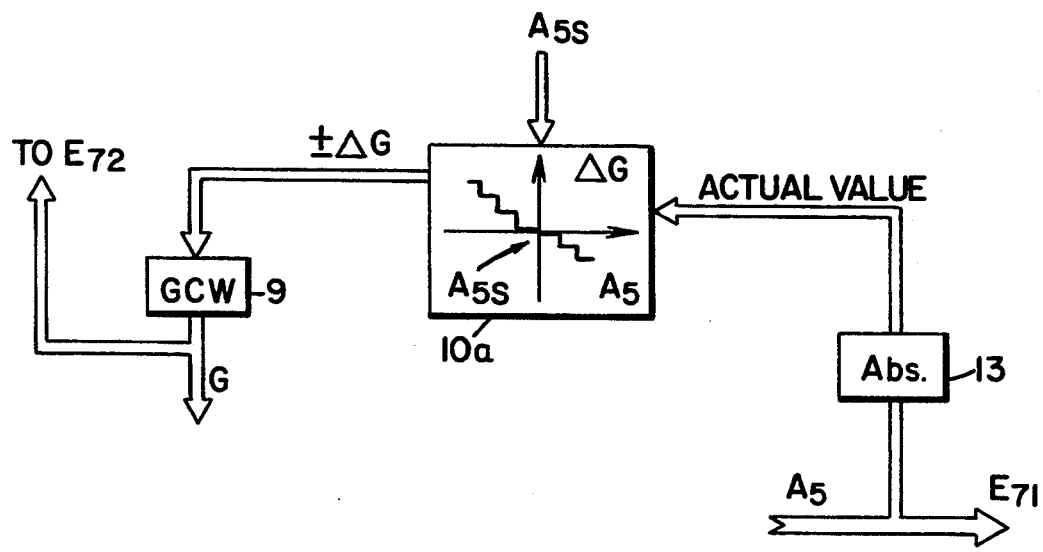
FIG. 2: A preferred embodiment variant of the amplification control feedback as used in the processing unit of FIG. 1.

FIG. 2 shows one preferred embodiment variant for the feedback of the output signal $A_5$ of the quantizer 5 onto the amplification G of the amplifier unit 3 of FIG. 1.

Amplification change quantities $\Delta G$ of both polarities, as a function of absolute signal values, are stored in a memory unit 10a on the output side of the quantizer 5. By specifying the absolute value of the output signal $A_5$ at which the amplification changes $\Delta G$ change sign, in accordance with the value $A_{5S}$ entered in block 10a, the design value (to be controlled) of the average absolute value of the output signal $A_5$ of the quantizer 5 will be preset. At 13 we see the absolute value forming unit for the signal $A_5$. The amplification changes $\pm \Delta G$ output from the table memory 10a as a function of signal $A_5$, will be sent to the memory unit 9 with the amplification control data, in accordance with the amplification control word GCW, which accordingly, increases or reduces the amplification G.

Figure 3A:
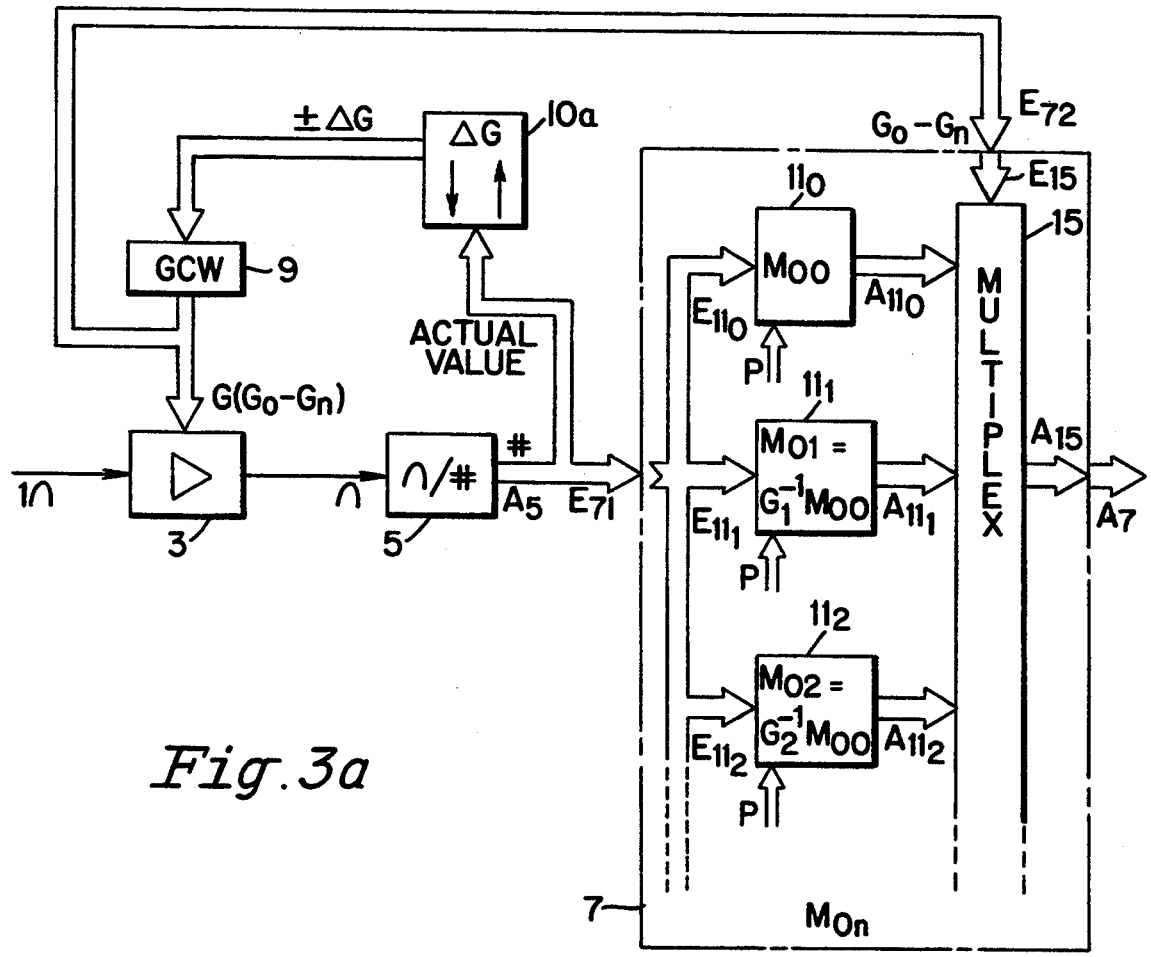
FIG. 3a: An initial embodiment variant of an analog-digital processing unit in accordance with this invention that operates according to the invented method, shown in principle in FIGS. 1 and 2, and based on a simplified functional block, signal-flow diagram.

Proceeding from FIGS. 1 and 2, FIG. 3a shows one possible embodiment variant of the memory and scaling unit 7 of FIG. 1. The reference numbers already introduced with respect to FIGS. 1 and 2 are retained for the same functions or functional units, etc.

The amplification G at the amplifier unit 3 is adjustable in stages $G_0, \ldots, G_n$, by means of the control data in the memory device 9. In accordance with the number of possible amplifications $n_g = n+1$, a number $(n+1)$ of memory segments $11_0, 11_1 \ldots 11_n$ is provided. In all memory segments $11_x$ with $0 \leq x \leq n$, all possible values of the output signal $A_5$—as illustrated at P—will be prestored; however, in each segment $11_x$, scaling will occur with the inverse value of the attendant amplification $G_x^{-1}$, that is, with $G_0^{-1}, G_1^{-1}, \ldots, G_n^{-1}$. The memory segments 11 will all be addressed jointly by the signal appearing at the output $A_5$ of the quantizer 5, in such a manner that given a particular digital output signal value at $A_5 = A_{5k}$ at all memory segments 11, the associated data values are addressable, which, without restriction of applicability, will appear scaled in segment $11_0$, as a result of the selection $G_0 = 1$, with the value equivalent to $A_{5k}$ at the output $A_5$, at the other segments $11_x$, each with the associated, inverse amplification factor $G_x^{-1}$.

On the output side of segments $11_x$ therefore, the values $A_{11k} = A_{5k} \cdot G_x^{-1}$ ($0 \leq x \leq n$) are applied.

These called up values $A_{11k}$, that is, all outputs of segment 11, are sent to a multiplexer unit 15. The multiplexer unit 15 will be addressed or driven at the input $E_{15}$ by the amplification control data GCW from the memory unit 9, corresponding to the input $E_{72}$, to the memory and scaling unit 7, according to FIG. 1, so that when instantaneous output signals $A_{11k}$ prevail, and at the same time an instantaneous amplification $G_k$ prevails, the output $A_{11k}$ for which $x = k$ will be selected and switched through, and thus $A_{15k} = A_{5k} \cdot G_k^{-1}$.

As is evident, this procedure will allow the potential to undertake the amplification compensation without complicated multipliers.

In FIG. 3a one possible implementation variant of the memory and scaling unit 7 was presented which will serve in particular as an illustrative example.

Figure 3B:
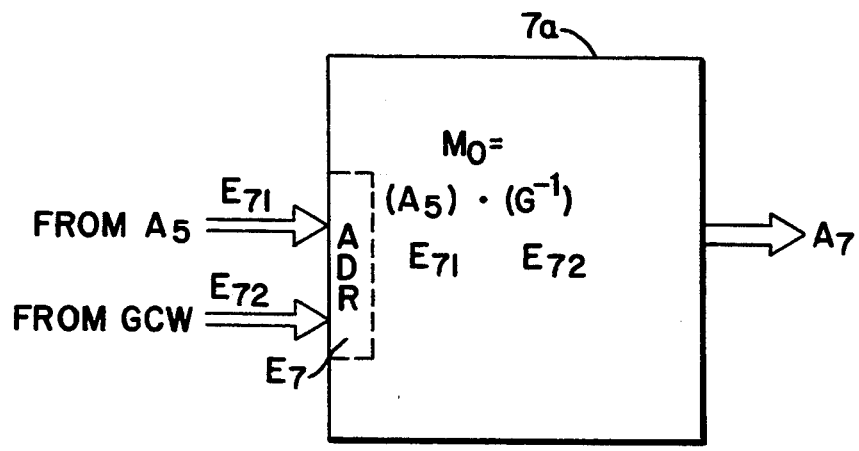
FIG. 3b: An additional, preferred embodiment variant of a memory and scaling unit provided on the processing unit of FIG. 1, and also of FIG. 3a, shown in schematic form based on one functional block.

As is shown in FIG. 3b, in a preferred manner, the memory and scaling unit 7 is configured as memory unit 7a, wherein all possible values of the signal $A_5$, each multiplied with all inverse amplification values $G^{-1}$, are stored. Analogously to the representation of FIG. 1, the addressing of the correct value with respect to quantizing $A_{5k}$ and also with respect to amplification $G_k$, will take place as is shown in FIG. 3b, via the addressing of the memory unit 7a by means of an address formed both from the value of $A_{5k}$ and from the value of $G_k$, at the addressing inputs $E_{71}$ from the output of the quantizer 5 of the $E_{72}$ from the output of the memory device 9 with the amplification control word GCW. Thus the multiplexer 15 illustrated in FIG. 3a is eliminated.

The memory size for the procedure as per FIG. 3b is significant, in particular for larger numbers $n_g$ of amplifier stages $\Delta G$.

If we take a look at a 5-stage quantizer 5 together with separate accounting for the sign and then a possible number $n_a$ of 64 ($2^5 \times 2$) and for example, a 5-bit amplifier control word in the memory device 9 then in the procedure as per FIG. 3, a memory size would be needed for $64 \cdot 32 = 2048$ values.

In this regard, an important advantage will be achieved through the procedure described below.

It is assumed here that the value of a binary number will change by a factor of 2, corresponding approximately to 6 dB, if it is shifted by one place, e.g. with respect to a floating point.

Proceeding from the above, the provided dynamic range will be divided into a number Z of 6 dB increments. Without restricting its overall applicability, as already stated above, $G_0 = 0$ dB was selected, and thus the dynamic range equals the maximum amplification $G_{max}$, that is:

$$G_{max} = Z \cdot 6 \text{ dB} + R,$$

where $R < 6$ dB denotes a remainder quantity. If an amplification gradation in $\Delta G$ steps of 6 dB is sufficient, then with a look back at FIGS. 3a, b, only every $n_a$ values of $A_5$ will have to be prestored; the compensation of the amplification in the mentioned 6 dB-increments can take place by corresponding shifting of the binary number representing an instantaneous value of $A_5$ by a number of places corresponding to the instantaneous amplification. In this case, nothing at all would have to be stored, because the address and content of the memory will coincide.

In the vast majority of cases, a gradation of the amplification G in $\Delta G$ steps of 6 dB will not suffice. In order to solve this problem while at the same time continuing to pursue the goal of reducing the memory size, the 6 dB amplification steps will be divided into $k_1$ amplification steps $\Delta G$, where $k_1$ is an integer. In accordance with the number $k_1$ of gradation steps of the 6 dB increments, a greater or smaller number of needed memory sites will result, since all interim gradations of the amplification compensation contained between the 6 dB increments—each multiplied with all possible $n_a$ values of the signal $A_5$—will have to be stored.

If $k_1 = 2$, then 128 values will have to be prestored; the $\Delta G$ increment will be 3 dB; for $k_1 = 3$, 192; the $\Delta G = 2$ dB etc. Without restricting overall applicability, hereafter let $k_1 = 4$ and also the $\Delta G$ corresponding scaling factor $2^{\frac{1}{4}}$, that is, $\Delta G$ is approximately 1.5 dB. Thus the memory will be reduced to 4 data sets, each accordingly with 0 dB, 1.5 dB, 3 dB, 4.5 dB scaled $n_a$ values of $A_5$, and also, according to the above example, the memory size will be reduced to the storage of 256 values.

The instantaneous amplification $G_k$ thus can be written as:

$$G_k = G_{k1} + G_{k2} - Z_k \text{ (6 dB)} + L_k(1,5 \text{ dB})$$

with $0 \leq L_k < 3$.

For the inverse amplification, we thus have:

$$G_k^{-1} - G_{k1}^{-1} + G_{k2}^{-1} = -Z_k(6\text{dB})L_k (1,5 \text{ dB}).$$

Figure 4:
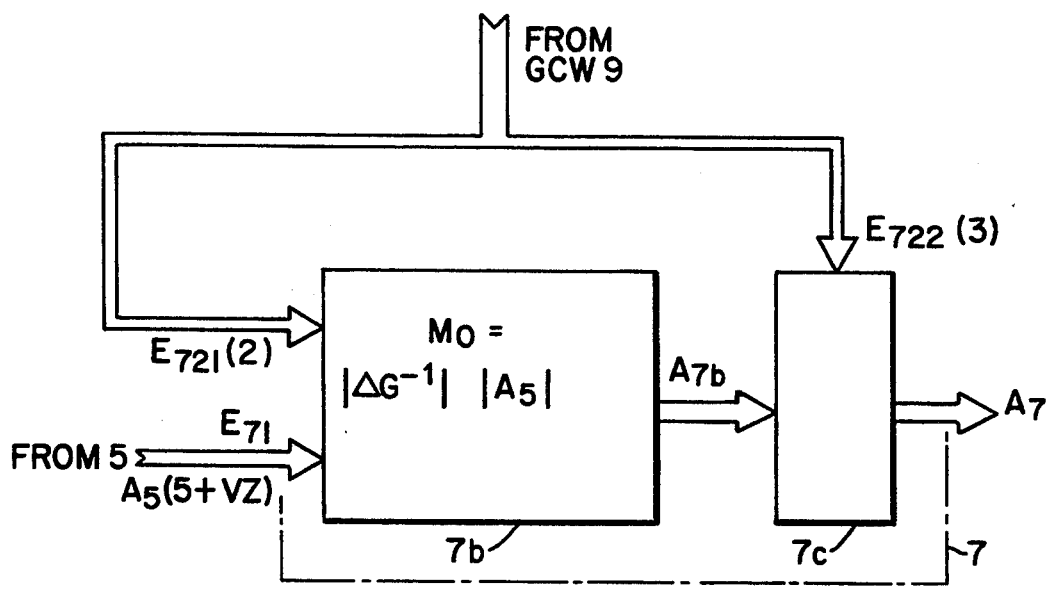
FIG. 4: A preferred embodiment variant of a memory and scaling unit of the analog-digital processing unit according to FIGS. 1 and 2, based on a simplified functional block, signal flow diagram.

FIG. 4 illustrates the functional block signal flow diagram of how the memory and scaling unit 7 is implemented according to FIG. 1 in a preferred type and manner.

All $n_a$ possible output values $A_5$ that can appear at the output of the quantizer 5, are stored in a memory block 7b, and of course, each is scaled with the values 1, $-\Delta G$, $-2 \cdot \Delta G$, ..., $-(k_1-1) \cdot -\Delta G$. In a preferred selection of $\Delta G$ as 1.5 dB, accordingly each of the $n_a$ values $A_5$ will correspond as follows: $-1.5$ dB·$A_5$; $-3$ dB·$A_5$ and $-4.5$ dB·$A_5$. Now in case of an instantaneous value occurring at the output of the quantizer $A_5$, this value—via the addressing input $E_{71}$ and with a first portion of the amplification control word GCW, will be scaled via the addressing input $E_{721}$, with an inverse value $-L_k$ ($\Delta G$) corresponding to the instantaneous amplification, and output to the output $A_{7b}$.

Now in case of a 5-bit amplification control word GCW, in this case, as stated in [], the two LSB of GCW will be used, with which the $L_k$ values 0, 1, 2, 3 will be addressed.

The other bits of the amplification control word GCW—in the example of this kind with a 5-bit word, this will be the three MSB—will be sent to a shift unit 7c, whereupon the number read out from the memory unit 7b with regard to the floating decimal, will be shifted by the number $Z_k$ of places specified at the control input $E_{722}$.

Figure 5:
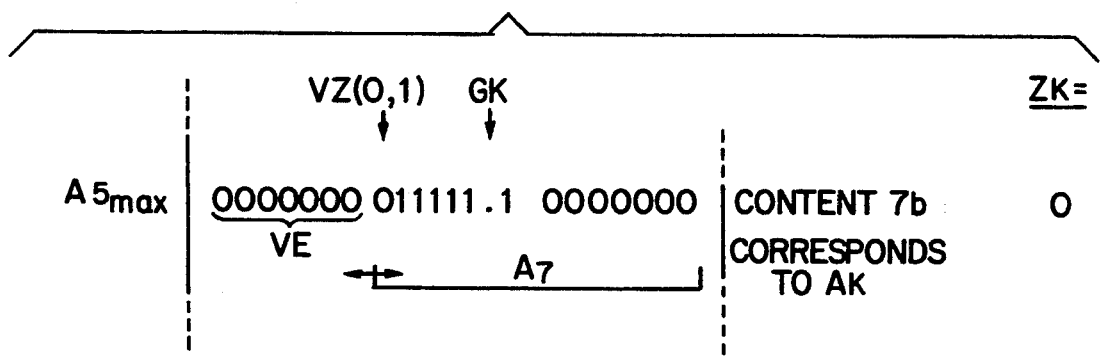
FIG. 5: A simplified representation of the memory content of a memory device on the unit configured as illustrated in FIG. 4, and the operation of its downstream unit operating like a shift register.
Figure 6:
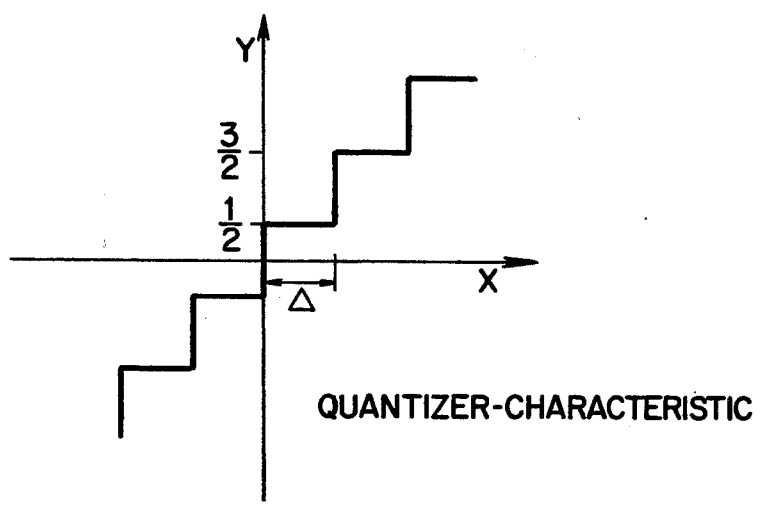
FIG. 6: A characteristic quantizing line of the preferred quantizer employed on the analog-digital processing unit in accordance with this invention.

In order to explain this further, FIG. 5 shows for example, the maximum value of the memory unit 7b. From this, it is first evident that 21-bit size words are stored in memory unit 7b, and the left seven bits are sign-expansion bits, the eighth bit is a sign bit, the ninth to thirteenth bits for $L_k = 0$ correspond to a value at the output $A_5$, and likewise for $L_k = 0$, bits 15 to 21 are filled with zeros. For $L_k = 0$ furthermore, the fourteenth bit is always set to 1, which is related to the particular quantization characteristic that is illustrated in FIG. 6. As is evident from FIG. 6, this quantizing corresponds to the allocation:

$$m \cdot \Delta \leq x < (m+1) \cdot \Delta \rightarrow y = (m + \tfrac{1}{2}).$$

wherein x represents the analog input signal, $\Delta$ is a fixed quantizing stage and y represents the digital value measured in units of this quantizing stage. Thus m takes on only integer values.

For $L_k$ not equal to zero, the relations described above of course will not apply, but rather in this case the scaled values will be stored, as explained above.

The word output from the shifter 7c is represented with the frame $A_7$. From this it is evident that a value will be emitted at the output of the shifter 7b that is shifted in one of eight possibilities with respect to the floating point GK, as a function of the control at the input $E_{722}$, by for example, the three remaining MSB of a 5-bit amplification control word GCW. Continuing on down, we obtain values attenuated, respectively, by $-Z_k \cdot 6$ dB. Using the explained example, due to the shifter unit 7c there results a possible amplification compensation of max. 42 dB (7·6 dB).

Figure 7:
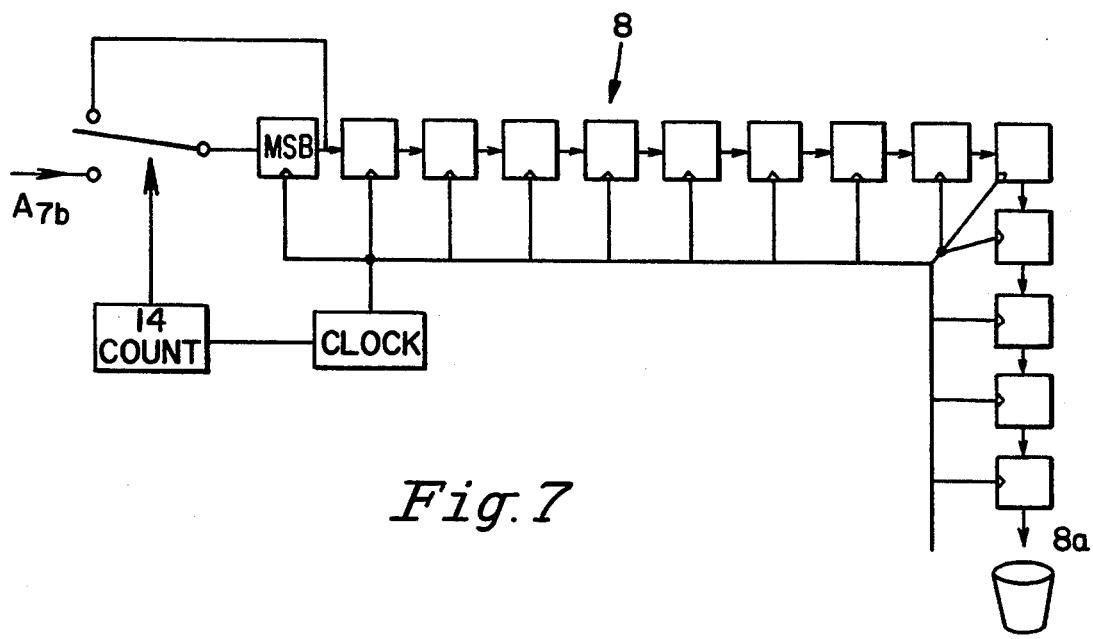
FIG. 7: A preferred embodiment variant of the unit per FIGS. 4 and 5 operating like a shift register.

With regard to the shifter unit 7c, we are dealing preferably with a shift register 8 as is illustrated in FIG. 7, which is clocked between 14 and 21 times for the case that, as in the preferred manner, a serial loading of the register is provided.

If $Z_k = 0$, then by means of 14 clock cycles, the rightmost 14 bits will be cycled from the 21 bit word in the memory 7b into the shift register 8. At the output $A_7$ the 14 bits will appear according to the $A_7$ frame position in FIG. 5 for $Z_k = 0$.

If $Z_k = 1$, then by means of 15 clock cycles, the rightmost 15 bits will be cycled from the 21 bit word in memory 7b into the shift register 8; the extreme right bit of the 21 bit word will be lost at 8a. At the output $A_7$ the 14 bit word will appear according to the $A_7$ frame position in FIG. 5 for $Z_{k=1}$ etc.

In every case, only sign-expansion bits will be read out from the 21 bit word after the 14th cycle, that is, after the 15th clock pulse. After the 14th cycle, the sign-bit is already in the MSB memory of the shift register. Thus in a preferred manner, the content of the MSB stage from the 15th clock pulse will no longer be changed, as illustrated in FIG. 4c, but rather only the following stages of the shift register will be fed in. But thus the 7 sign-expansion bits VE in the memory 7b can be omitted; it will become $\tfrac{1}{3}$ smaller.

Now using the illustrated example with a 5 bit+sign-bit quantizer and a 5 bit amplification control word GCW, with the two LSB of GCW and the output value of the quantizer as address in memory unit 7b, the $A_5$-value scaled accordingly by $-L_k \Delta G$ will be selected, and by means of the shifter unit 7c, this selected value, as a function of the remaining three MSB from the GCW, will be further scaled by $-Z_k \cdot 6$ dB.

The analog-digital processing unit described is suitable in particular for the processing of audio signals, in particular for voice signals. In this case, in a manner yet to be described, the filters will be connected upstream and downstream of the configuration already described, where the upstream digital filter, and/or the selected procedure for digital filtering, considered by itself and employable for additional applications, is an invented item.

Figure 8:
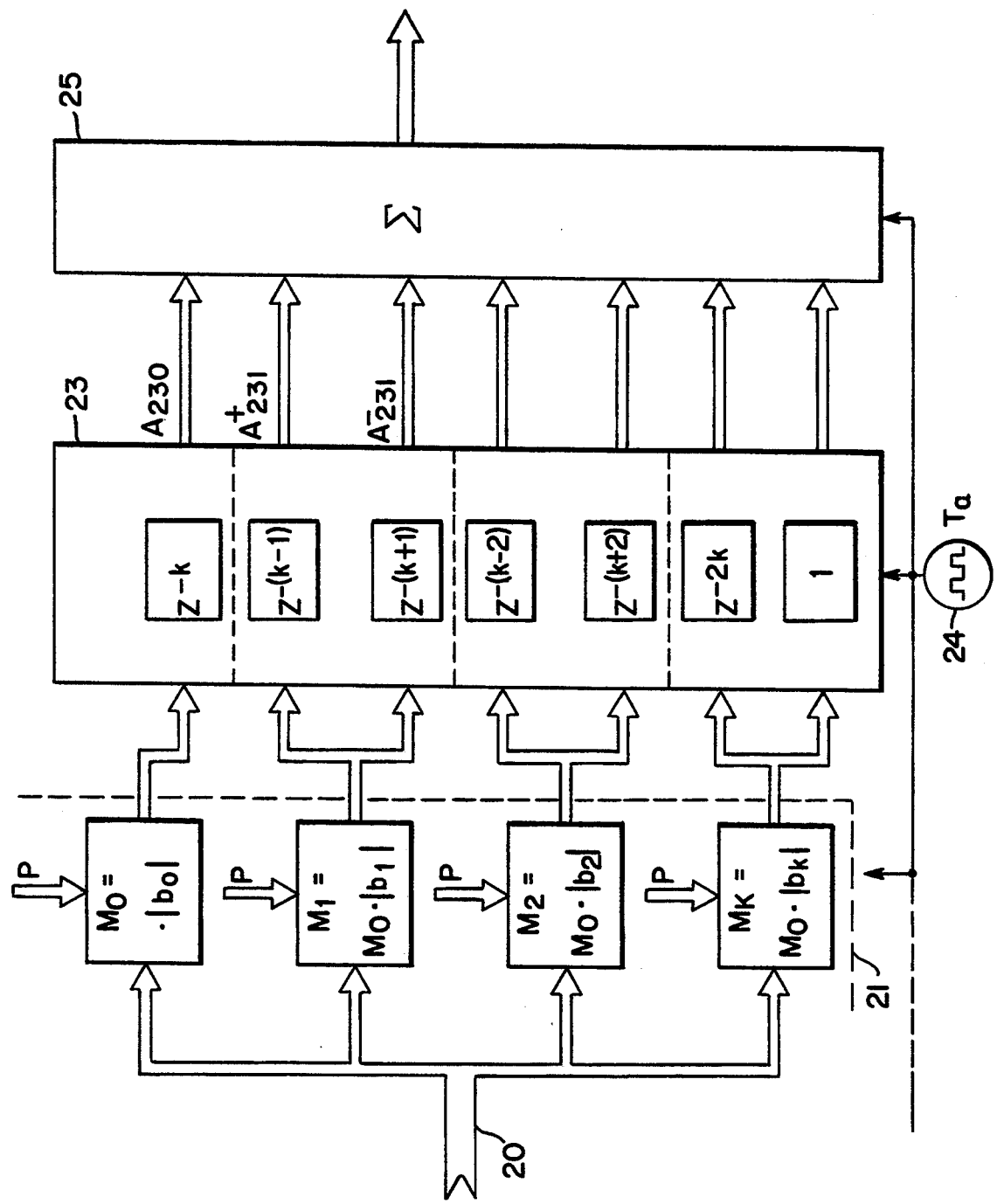
FIG. 8: A digital filter configuration operating according to the filter method in accordance with this invention and designed in the form of a simplified functional block, signal flow diagram.

FIG. 8 shows the principal structure of the digital filter in accordance with this invention. In explaining it, we will not go into the calculation theory of digital filters; as any expert in the field knows, there is already a widely available literature on this topic.

The digital signal to be filtered as shown at 20, will be sent to a memory unit 21 shown with a dashed-line border. For a particular number of filter coefficients $b_k$ specified according to the selected filter, in the memory unit 21 a corresponding number of memory segments $M_0$ to $M_k$ is provided. In each of the memory segments $M_0$ to $M_k$, all possible values of the input, digital signal 20 are prestored or predetermined, as illustrated at P. These values are scaled in segment $M_0$ with the filter coefficient $b_0$, in segment $M_1$ with the filter coefficient $b_1$, etc.

The outputs of the memory segments $M_0$ to $M_k$ are fed to a time delay unit 23, where the output of the segment $M_0$ is time delayed by a number k of timing intervals—relative to the clock period $T_a$ of a clock generator 24 that times the digital processing—and is sent out to the output $A_{230}$.

Accordingly, the outputs of the segments $M_1$ to $M_k$ will be output time delayed, as stated. The outputs of the delay unit 23 are all run to an adder 25.

With the digital input data 20, the prestored values will be called up; these values are scaled by the corresponding filter coefficients and they correspond to the particular value of the input data 20. The values will be fed into the adder 25 via the time delay unit 23. In this manner, a linear-phase transversal filter will be created that does not use any complicated multipliers.

Figure 9:
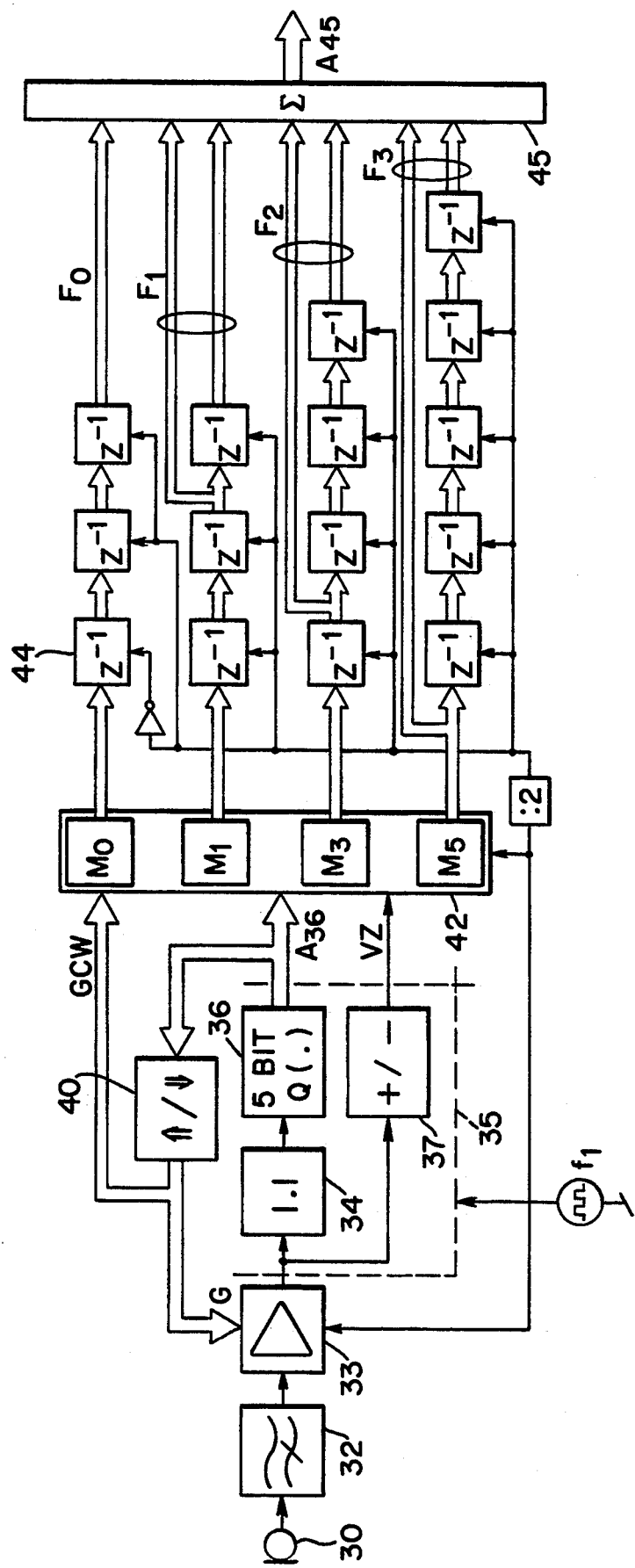
FIG. 9: An analog-digital processing unit in accordance with the present invention, in particular for use on audio signals, in particular on voice signals based on the simplified function block, signal flow diagram, where the inherently inventive digital filter of FIG. 8 is connected downstream of the unit in accordance with FIG. 5.

A filter of this kind is excellently suited [to work] in combination with the described analog-digital processing unit, which is readily evident, so that both on the output side of the mentioned analog-digital processing unit, and also on the input side of the filter per the invention explained on the basis of FIG. 8, prestored values will be used in part, according to the potential values of the digital signal to be treated, FIG. 9 shows one preferred sample design of an analog-digital processing unit per this invention, for voice signals; this processing unit is obtained from the invented combination of the unit presented on the basis of FIGS. 1 to 7, and on the basis of the digital filter explained in principle with reference to FIG. 8, with other additional units.

The audio signal, in particular voice signal, will be sent via a microphone 30 to a first order high-pass filter 32, with a cut-off frequency of approximately 1 kHz. Due to this filter, the spectrum of the voice signal that has an elevation on average in the region of 500 Hz, will be flattened out, so that the signal-to-quantizing noise ratio will be compensated over the entire bandwidth. A compensation of the resultant sound compression is possible in a simple manner in digital signal processing following the analog-digital processing unit.

On the input side of the analog-digital processing unit, no anti-aliasing filter is provided.

On the output side of the high pass filter 32, the analog signal will be fed to the amplifier 33, which—analogous to the amplifier 3 described above—has an amplification G that is adjustable in 1.5 dB steps. The amplified analog signal will be sent to the quantizer 35 therein, which is analogous to the quantizer 5 described unit above, via a rectifier 34, a 5-bit quantizer 36 and, in parallel structure, a sign detector unit 37. Except for the sign information VZ arising from the output side of the unit 37, analogous to the output $A_5$ described above, the output $A_{36}$ of the 5 bit quantizer 36 will be fed back to the amplifier 33 via the amplification change table 40, analogous to the above-described 10a, via a memory device not illustrated here, analogous to 9, as described above.

The amplification control data GCW, the sign information VZ and the output $A_{36}$ of the quantizer 36, will be sent to a memory and scaling unit 42. It is divided into four equally structured memory and scaling segments $M_0$, $M_1$, $M_3$, $M_5$. The segment $M_0$ of the memory and scaling unit 42 is designed as illustrated by 7 in FIG. 4 and as explained in connection with FIGS. 5 to 7; and it is scaled according to the explanations of FIG. 5, by increments of $2^{-\frac{1}{4}}$ increments, but moreover, it is also scaled with an additional filter coefficient $b_0$.

The segment $M_1$ is likewise configured as in FIG. 4 under 7. The data sets prestored in Segment $M_1$ however, are not like those in $M_0$ with $b_0$, but rather are scaled by a filter coefficient $b_1$. The same also applies for $M_3$ and $M_5$.

On the output side of the memory and scaling unit 42, digital signals appear that are allocated to the segments $M_0$, $M_1$, $M_3$, $M_5$; these digital signals correspond as follows:

From $M_0$: To the instantaneous value at the output $A_{36}$, controlled by the amplification control data GCW—corresponding to the inverse, instantaneous amplification at amplifier 33—and additionally scaled by $b_0$.

From $M_1$: Like $M_0$, but additionally scaled with $b_1$ instead of $b_0$.

Accordingly also for $M_3$ and $M_5$.

The amplification G at amplifier 33 is adjustable between 0 and 46.5 dB in increments of 1.5 dB, tailored to the $2^{-\frac{1}{4}}$ scaling in $M_0$ and thus $M_1$ to $M_5$.

The shift units allocated to these segments, according to 7c of FIG. 4, and also FIG. 7, produce 14 bit words. Selection of scaling and readout on the shift units 7b will be controlled by the amplification control word GCW.

In order to make do without analog anti-aliasing filters, a sensing rate of preferably 32 kHz is used on the analog-digital processing unit, and on the output side of the memory and scaling unit 42, a low-pass digital filter is provided that is designed in principle like FIG. 8. This filter is laid out so that signal components above 8 kHz are sufficiently attenuated, so that the sensing rate can be reduced to 16 kHz without producing any disturbing aliasing components. Furthermore, the filter is designed so that the filter coefficients $b_k$ for all even numbered k not equal to zero, will disappear. Thus the implementation expense will be greatly reduced. Only four filter coefficients are used, namely for k=0, ±1, ±3 and +5. As has been mentioned, the data values in the segments $M_0$, $M_1$, $M_3$, $M_5$ are stored accordingly and scaled or multiplied with the associated, filter coefficients just mentioned.

At the aforementioned sensing rate of preferably 32 kHz, the signal components of the sound source above 16 kHz—as is known to the expert in the field—will be stepped down to the frequency range of 0 to 16 kHz (aliasing effect). The digital low-pass filter attenuates the signal components of the sound source in the frequency range of 8 to 16 kHz, just like those that were stepped down from the frequency range of 16 to 24 kHz into the range of 8 to 16 kHz. For input signals with only negligible signal components above 24 kHz, that is, for electrically converted acoustic signals, the aliasing effect will thus be avoided by oversensing ($f_1 = 32$ kHz) and subsequent digital low-pass filtering, including reduction of the sensing rate.

The digital filter can be operated at the reduced sensing rate of 16 kHz. The provision of the time delay elements 44, designed according to half of the utilized clock frequency $\frac{1}{2} f_1$, is readily obtained from FIG. 6 by a corresponding signal division per segment M, for each $b_{+k}$ and $b_{-k}$. The delayed signals $F_0$ to $F_5$, for each $b_{+k}$ and each from one of the segments $M_0$ to $M_5$, will be sent to an addition unit 45, as was explained with reference to FIG. 5; at its output $A_{45}$, one digital value will appear per cycle as output value of the analog-digital processing unit as per this invention, with built in anti-aliasing processing.

I claim:

1. A method for digitizing a band-limited, analog signal, said method comprising:
   amplifying the analog signal;
   digitizing the amplified analog signal in a preset number of quantizing steps;
   setting a prevailing amplification of the analog signal so that the average value over time of the size of the digitized analog signal is controlled to a predetermined value;
   prestoring all possible values of the digitized analog signal based upon the number of quantizing steps; and
   retrieving a prestored signal corresponding to the digitized analog signal amplified with an inverse amplification of the prevailing amplification.

2. A method according to claim 1, including calling up amplification change values, and selecting a predetermined design amplification value at which amplification value of the digitized analog signal a change in sign of the called up amplification change values occurs.

3. A method according to claim 1, including prestoring all possible values of the digitized analog signal with all possible values of inverse amplification, and addressing and calling up a particular prevailing, digitized, analog signal and also an inverse prevailing amplification.

4. A method according to claim 1, including addressing a corresponding, prestored value of the digitized analog signal, and outputting for an at least partial accounting of the prevailing amplification the addressed value with regard to a floating point shifted by a number of places specified at least by a factor of the prevailing amplification.

5. A method according to claim 4, including prestoring and scaling all possible values of the digitized, analog signal with predetermined, first inverse amplification factors, and calling up a prestored value, and output shifting the prestored value with respect to the floating point by a number of places given by another factor of the prevailing preamplification control value.

6. A method according to claim 1, including adjusting the amplification in stages, corresponding to a factor based upon a base value of the digital representation of the digitized analog signal.

7. A method according to claim 6, including subdividing the stages into steps corresponding to about $2^{\frac{1}{4}}$.

8. An analog-digital processing unit, said unit comprising:
   an amplifier to which an analog signal is fed and whose amplification is adjustable in stages;
   an analog-digital quantizer connected downstream of the amplifier unit;
   a memory and scaling unit connected downstream of the analog-digital quantizer;
   wherein the output of the quantizer is fed back to an amplification control input of the amplifier unit via a comparator unit; and
   wherein the output of the quantizer and the output of the comparator unit act on output control inputs at the memory and scaling unit.

9. An analog-digital processing unit according to claim 8, wherein the comparator unit includes a table memory that is fed, on the input side, with at least the absolute value of the digitized analog signal from the output of the quantizer, and that acts, on the output side, on the amplification control input.

10. An analog-digital processing unit according to claim 9, wherein an output word of the quantizer acts on the amplification control input via the amplification change table to provide positive and negative amplification changes.

11. An analog-digital processing unit according to claim 8, wherein the memory and scaling unit includes a memory unit and wherein both the output of the quantizer and also the output of the comparator unit act on address inputs on at the memory unit.

12. An analog-digital processing unit according to claim 8, wherein the memory and scaling unit includes a memory unit and a shift unit connected downstream of the memory unit and which shift unit operates like a shift register, and wherein the output of the quantizer is fed to address inputs at the memory unit, and wherein at least a portion of the output of the comparator unit is fed to control inputs at the shift unit.

13. An analog-digital processing unit according to claim 12, wherein the shift unit includes a shift register.

14. An analog-digital processing unit according to claim 13, wherein the shift register is loaded serially from the memory unit, and wherein the input-side register stage is switchable on the output side, to its input, after a specified number of read cycles.

15. An analog-digital processing unit according to claim 12, wherein an additional portion of the output of the comparator unit is also fed to addressing inputs at the memory unit.

16. An analog-digital processing unit according to claim 8, wherein the digital processing takes place in binary form, and the amplification is stepped in increments of $2^{\frac{1}{4}}$.

17. An analog-digital processing unit according to claim 8, for the processing of band-limited, analog signals, in particular voice signals, wherein the quantizer is a 6-bit quantizer, including a sign-bit.

18. An analog-digital processing unit according to claim 16, wherein the digital processing takes place at a clock frequency that is greater than twice the maximum frequency of the analog signal band.

19. An analog-digital processing unit according to claim 18, wherein the digital processing takes place at a clock frequency that is about four times the maximum frequency of the analog signal band.

20. An analog-digital processing unit according to claim 17, wherein the quantizer includes an absolute value former with a downstream 5-bit quantizer and also a sign detector.

21. An analog-digital processing unit according to claim 8, wherein the amplifier unit includes an upstream high-pass filter for the processing of voice signals.

22. An analog-digital processing unit according to claim 21, wherein the upstream high-pass filter is a first order filter with a limit frequency of about 1 kHz.

23. An analog-digital processing unit according to claim 8, including a digital, low-pass filter connected downstream of the memory and scaling unit.

24. An analog-digital processing unit according to claim 23, including a plurality of memory and scaling units having prestored values scaled with filter coefficients, and wherein the outputs of the memory and scaling units are fed through time delay elements to an addition unit for the formation of the digital filter.

25. An analog-digital processing unit according to claim 24, wherein the digital filter is operated at a lower frequency than the frequency of an upstream processing unit.

26. An analog-digital processing unit according to claim 25, wherein the digital filter is operated at about one-half the frequency of the upstream processing unit.

* * * * *